(12) United States Patent
Zhu

(10) Patent No.: US 10,185,166 B2
(45) Date of Patent: Jan. 22, 2019

(54) DIGITAL TO ANALOG CONVERTER AND DISPLAY PANEL HAVING DIGITAL TO ANALOG CONVERTER

(71) Applicant: Shenzhen China Star Optoelectronics Technology Co., Ltd., Shenzhen (CN)

(72) Inventor: Jiang Zhu, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 168 days.

(21) Appl. No.: 15/128,379

(22) PCT Filed: Jul. 8, 2016

(86) PCT No.: PCT/CN2016/089364
§ 371 (c)(1),
(2) Date: Sep. 22, 2016

(87) PCT Pub. No.: WO2017/201826
PCT Pub. Date: Nov. 30, 2017

(65) Prior Publication Data
US 2018/0164623 A1  Jun. 14, 2018

(30) Foreign Application Priority Data
May 24, 2016  (CN) .......................... 2016 1 0352242

(51) Int. Cl.
*G02F 1/133*  (2006.01)
*G09G 3/36*  (2006.01)
(Continued)

(52) U.S. Cl.
CPC .......... *G02F 1/13306* (2013.01); *G09G 3/36* (2013.01); *G09G 3/3648* (2013.01);
(Continued)

(58) Field of Classification Search
CPC ..................... G02F 1/13306; G09G 2310/027; G09G 3/36; G09G 3/3648; G09G 3/3685; H03M 1/66; H03M 1/76
(Continued)

(56) References Cited

U.S. PATENT DOCUMENTS

| 8,188,898 B2 | 5/2012 | Tu et al. |
| 8,648,779 B2 | 2/2014 | Hsueh et al. |

(Continued)

FOREIGN PATENT DOCUMENTS

| CN | 101102113 | 1/2008 |
| CN | 101388670 | 3/2009 |

(Continued)

OTHER PUBLICATIONS

International Search Report for PCT/CN2016/089364, Completed by the Chinese Patent Office dated Jan. 5, 2017, 13 Pages.

*Primary Examiner* — Tony Davis
(74) *Attorney, Agent, or Firm* — Mintz Levin Cohn Ferris Glovsky and Popeo, P.C.; Kongsik Kim; Jhongwoo Jay Peck

(57) ABSTRACT

A digital to analog converter includes N lines of transistors. A number of each rear line of transistors is equal to a half of a number of each adjacent front line of transistors. Each transistor includes a conducting terminal, an input terminal, and an output terminal. In any two adjacent lines of transistors, input terminals of the first transistors and input terminals of the second transistors of the rear line are connected to output terminals of the first transistors of a front line respectively. Output terminals of the second transistors of the front line are connected to output terminals of the first transistors of the front line. Output terminals of the second transistors of the rear line of transistors are connected to output terminals of the first transistor of the rear (Continued)

line of transistors. Conducting terminals of each line of transistors are connected to each other.

12 Claims, 2 Drawing Sheets

(51) Int. Cl.
*H03M 1/66* (2006.01)
*H03M 1/76* (2006.01)

(52) U.S. Cl.
CPC ............ *G09G 3/3685* (2013.01); *H03M 1/66* (2013.01); *G09G 2310/027* (2013.01); *H03M 1/76* (2013.01)

(58) Field of Classification Search
USPC .................................. 345/156–158, 170–178
See application file for complete search history.

(56) References Cited

U.S. PATENT DOCUMENTS

| | | |
|---|---|---|
| 2009/0066681 A1 | 3/2009 | Kim et al. |
| 2009/0140898 A1* | 6/2009 | Ceballos ............... H03M 3/372 |
| | | 341/143 |
| 2011/0090198 A1* | 4/2011 | Hsueh .................. G09G 3/3688 |
| | | 345/211 |

FOREIGN PATENT DOCUMENTS

| | | |
|---|---|---|
| CN | 101996598 | 3/2011 |
| CN | 102045068 | 5/2011 |
| KR | 10-0738196 B1 | 7/2007 |
| KR | 20070070992 | 7/2007 |

* cited by examiner

FIG. 1 ⟨Related Art⟩

DIGITAL TO ANALOG CONVERTER AND DISPLAY PANEL HAVING DIGITAL TO ANALOG CONVERTER

CROSS-REFERENCE TO RELATED APPLICATION

This application is the U.S. national phase of PCT Application No. PCT/CN2016/089364 filed on Jul. 8, 2016, which claims priority to CN Patent Application No. 201610352242.6 filed on May 24, 2016, the disclosures of which are incorporated in their entirety by reference herein.

BACKGROUND OF THE INVENTION

1. Field of the Invention

The present invention relates to a digital to analog converting field, especially relates to a digital to analog converter and a display panel having the digital to analog converter.

2. Description of Related Art

Liquid crystal display televisions, which have a small size, a light weight, and an excellent display effect, are very popular to people. Resources become poor with the development of economy. Thus, it is a problem how to design liquid crystal displays with excellent display effect by using less resources.

A circuit drive system of a display panel (such as a liquid crystal display) includes a data control module, a source converting module, a Gamma voltage drive module, a data drive module, and a scanning drive module. Wherein the cost of the data control module in the entire circuit drive system. The digital to analog converter of the data drive module includes a plurality of transistors. Referring to FIG. 1, a 5-bit digital to analog converter includes five lines of transistors. Each line of transistors includes 32 transistors. The converter has a complex structure with a high cost because of so many transistors.

Thus, to solve above technical problem, a digital to analog converter and a display panel having the digital to analog converter are required.

SUMMARY OF THE INVENTION

In order to overcome the deficiency of the related art, the purpose of the present disclosure is to provide a digital to analog converter and a display panel having the digital to analog converter.

In order to achieve the above purpose, a technology solution provided by the embodiment of the present disclosure is:

A digital to analog converter includes N lines of transistors. A number of each rear line of transistors is equal to a half of a number of each adjacent front line of transistors. A number of the N lines of transistors is equal to $$\sum_{1}^{N} 2^{M}.$$

M, N is natural numbers, N is greater than 1, and M is no less than 1 and not greater than N. Each transistor includes a conducting terminal, an input terminal, and an output terminal; a number of a first line of transistors is $2^N$, and a number of a last line of transistors is 2. Input terminals of the first line of transistors are configured to receive $2^N$ different voltage signals. Each line of transistors includes a half of first transistors and a half of second transistors. A conducting level of the half of first transistors is different from a conducting level of the half of second transistors. In any two adjacent lines of transistors, input terminals of the first transistors and input terminals of the second transistors of the rear line are connected to output terminals of the first transistors of a front line respectively. Output terminals of the second transistors of the front line are connected to output terminals of the first transistors of the front line, and output terminals of the second transistors of the rear line of transistors are connected to output terminals of the first transistor of the rear line of transistors. Conducting terminals of each line of transistors are connected to each other and receiving a high level signal or a low level signal indicating a digital signal; and output terminals of the two transistors of the last line of transistors are connected to each other and configured to output a converted analog signal.

As a further improvement of the present disclosure, the transistors are field effect transistors, the conducting terminal is a gate of the field effect transistor, the input terminal is a drain of the field effect transistor, and the output terminal is a source of the field effect transistor.

As a further improvement of the present disclosure, the first transistor is an N channel field effect transistor, and the second transistor is a P channel field effect transistor.

As a further improvement of the present disclosure, the transistors are triode transistors, the conducting terminal is a base of the triode transistor, the input terminal is a collector of the triode transistor, and the output terminal is an emitter of the triode transistor.

As a further improvement of the present disclosure, the conducting terminal of the first transistor is configured to receive a low level signal to be conducted, and the conducting terminal of the second transistor is configured to receive a high level signal to be conducted.

Correspondingly, a display panel includes the above digital to analog converter.

The benefit of the present disclosure is: the digital to analog converter of the present disclosure including a plurality of lines of transistors; the number of the rear line of transistors being equal to the number of the adjacent front line of transistors; the digital to analog converter having a simple structure and less transistors for converting digital signals, thereby reducing the cost of the converter.

DETAILED DESCRIPTION OF THE PREFERRED EMBODIMENT

The following content combines with the figures and the embodiments for describing the present invention in detail. It is obvious that the following embodiments are only some embodiments of the present invention. For the person of ordinary skill in the art without creative effort, the other embodiments obtained thereby are still covered by the present invention.

Figure 1:
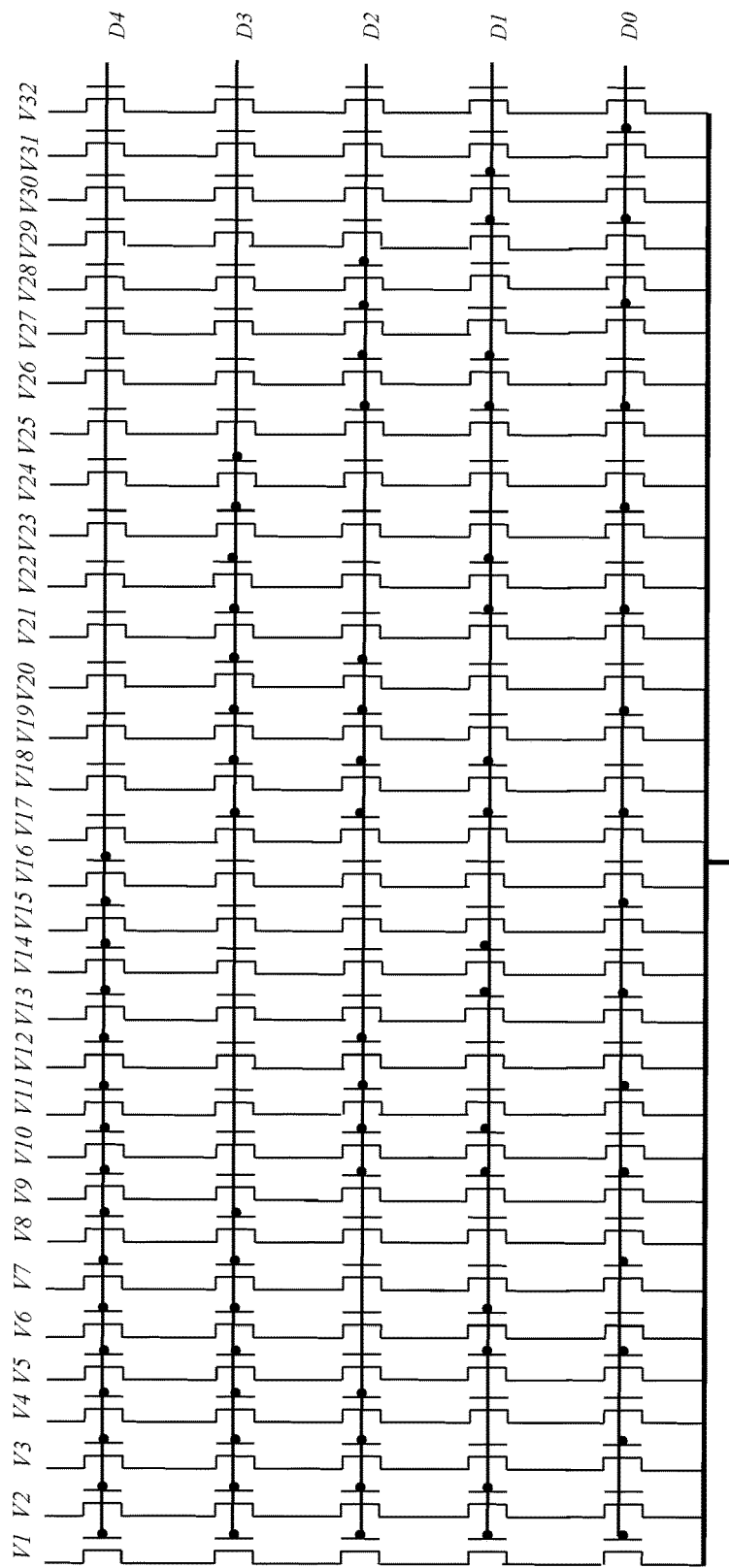
FIG. 1 is a circuit diagram showing the digital to analog converter of the related art.
Figure 2:
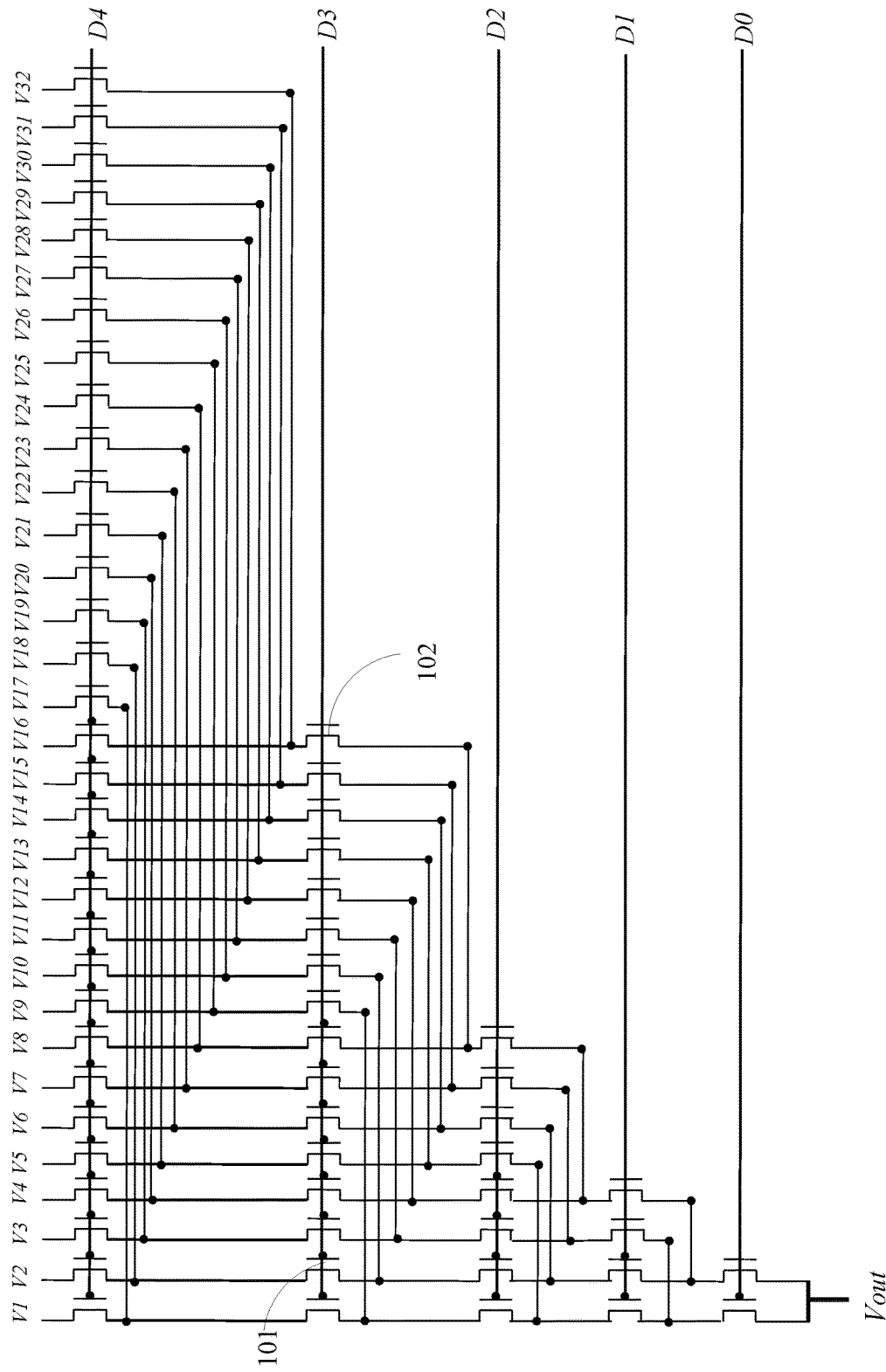
FIG. 2 is a circuit diagram showing the digital to analog converter according to an embodiment of the present disclosure.

Referring to FIG. 1, a display panel (now shown) includes a digital to analog converter. The digital to analog converter includes N lines of transistors. The number of each line of transistors is arranged in a way that the number of a rear line of transistors is a half of the number of a front line of transistors. The number of the N lines of transistors is $$\sum_{1}^{N} 2^M.$$

M, N are natural numbers, N is greater than 1, and M is no less than 1 and not greater than N. Each transistor includes a conducting terminal, an input terminal, and an output terminal. The number of the first line of transistors is $2^N$, and the number of a last line of transistors is 2. The display panel further includes $2^N$ different voltage signals (V1, V2, V3, . . . V32). The input terminals of the first line of transistors is used for receiving $2^N$ different voltage signals (V1, V2, V3, . . . V32).

Each line of transistors comprises a half of first transistors 101 and a half of second transistors 102. The conducting level of the conducting terminal of the first transistor 101 is opposed to the conducting level of the conducting terminal of the second transistor 102. In the embodiment, the conducting terminal of the first transistor 101 is used for receiving a low level to be conducted, and the conducting terminal of the second transistor 102 is used for receiving a high level to be conducted. In any two adjacent lines of transistors, input terminals of the first transistors and input terminals of the second transistors of the rear line are connected to output terminals of the first transistors of a front line respectively, output terminals of the second transistors of the front line are connected to output terminals of the first transistors of the front line, and output terminals of the second transistors of the rear line of transistors are connected to output terminals of the first transistor of the rear line of transistors. The conducting terminals of each line of transistors are connected to each other and receive a high level signal or a low level signal (D1, D1, D2, D3, D4) indicating a digital signal. The output terminals of the two transistors of the last line of transistors are connected to each other and used for outputting a converted analog signal Vout.

In the present embodiment, the transistors are field effect transistors. The conducting terminal is a gate of the field effect transistor, the input terminal is a drain of the field effect transistor, and the output terminal is a source of the field effect transistor.

In use, when the signals D0, D1, D2, D3, D4 are different high or low level signals indicating data signal, the transistor are be conducted to enable the voltage value of the converted analog signal Vout to be equal to the voltage value of one of the voltage signals V1, . . . V32. For example, when the signal D3 of the signals D0, D1, D2, D3, D4 is low level and others are high levels, Vout is equal to V24.

In another embodiment, the transistors are the transistors are triode transistors, the conducting terminal is a base of the triode transistor, the input terminal is a collector of the triode transistor, and the output terminal is an emitter of the triode transistor.

The number of each line of transistors is arranged in a way that the number of a rear line of transistors is a half of the number of a front line of transistors in the digital to analog converter of the present disclosure, the digital to analog converter has a simple structure and less transistors for converting the same digital signals relative to the converter of the prior art, thereby reducing the cost of the converter.

For the person skilled in the art, obviously, the present invention is not limited to the detail of the above exemplary embodiment. Besides, without deviating the spirit and the basic feature of the present invention, other specific forms can also achieve the present invention. Therefore, no matter from what point of view, the embodiments should be deemed to be exemplary, not limited. The range of the present invention is limited by the claims not by the above description. Accordingly, the embodiments are used to include all variation in the range of the claims and the equivalent requirements of the claims. It should not regard any reference signs in the claims as a limitation to the claims.

Besides, it can be understood that, although the present disclosure is describe according to the embodiments, each embodiment does not include only on dependent technology solution. The description of the present disclosure is only for clarity. The person skilled in the art should regard the present disclosure as an entirety. Technology solutions in the embodiments can be adequately combined to form other embodiments that can be understood by the person skilled in the art.

What is claimed is:

1. A digital to analog converter comprising N lines of transistors; wherein a number of each rear line of transistors is equal to a half of a number of each adjacent front line of transistors; a number of the N lines of transistors is equal to $$\sum_{1}^{N} 2^M,$$

M, N being natural numbers, N being greater than 1, and M being no less than 1 and not greater than N; each transistor comprises a conducting terminal, an input terminal, and an output terminal; a number of a first line of transistors is $2^N$, and a number of a last line of transistors is 2; input terminals of the first line of transistors is configured to receive $2^N$ different voltage signals; each line of transistors comprises a half of first transistors and a half of second transistors; a conducting level of the half of first transistors being different from a conducting level of the half of second transistors; in any two adjacent lines of transistors, input terminals of the first transistors and input terminals of the second transistors of the rear line being connected to output terminals of the first transistors of a front line respectively, output terminals of the second transistors of the front line being connected to output terminals of the first transistors of the front line, and output terminals of the second transistors of the rear line of transistors being connected to output terminals of the first transistor of the rear line of transistors; conducting terminals of each line of transistors being connected to each other and receiving a high level signal or a low level signal indicating a digital signal; and output terminals of the two transistors of the last line of transistors being connected to each other and configured to output a converted analog signal.

2. The digital to analog converter according to claim 1, wherein the transistors are field effect transistors, the conducting terminal is a gate of the field effect transistor, the input terminal is a drain of the field effect transistor, and the output terminal is a source of the field effect transistor.

3. The digital to analog converter according to claim 2, wherein the first transistor is an N channel field effect transistor, and the second transistor is a P channel field effect transistor.

4. The digital to analog converter according to claim 1, wherein the transistors are triode transistors, the conducting terminal is a base of the triode transistor, the input terminal is a collector of the triode transistor, and the output terminal is an emitter of the triode transistor.

5. The digital to analog converter according to claim 1, wherein the conducting terminal of the first transistor is configured to receive a low level signal to be conducted, and the conducting terminal of the second transistor is configured to receive a high level signal to be conducted.

6. A liquid crystal display comprising the digital to analogue converter according to claim 1.

7. A display panel, the display panel comprising a digital to analog converter, the digital to analog converter comprising N lines of transistors; wherein a number of each rear line of transistors is equal to a half of a number of each adjacent front line of transistors; a number of the N lines of transistors is equal to $$\sum_{1}^{N} 2^{M},$$

M, N being natural numbers, N is greater than 1, and M is no less than 1 and not greater than N; each transistor comprises a conducting terminal, an input terminal, and an output terminal; a number of a first line of transistors is $2^N$, and a number of a last line of transistors is 2; input terminals of the first line of transistors is configured to receive $2^N$ different voltage signals; each line of transistors comprises a half of first transistors and a half of second transistors; a conducting level of the half of first transistors being different from a conducting level of the half of second transistors; in any two adjacent lines of transistors, input terminals of the first transistors and input terminals of the second transistors of the rear line being connected to output terminals of the first transistors of a front line respectively, output terminals of the second transistors of the front line being connected to output terminals of the first transistors of the front line, and output terminals of the second transistors of the rear line of transistors being connected to output terminals of the first transistor of the rear line of transistors; conducting terminals of each line of transistors being connected to each other and receiving a high level signal or a low level signal indicating a digital signal; and output terminals of the two transistor of the last line of transistors being connected to each other and configured to output a converted analog signal.

8. The display panel according to claim 7, wherein the transistors are field effect transistors, the conducting terminal is a gate of the field effect transistor, the input terminal is a drain of the field effect transistor, and the output terminal is a source of the field effect transistor.

9. The display panel according to claim 8, wherein the first transistor is an N channel field effect transistor, and the second transistor is a P channel field effect transistor.

10. The display panel according to claim 7, wherein the transistors are triode transistors, the conducting terminal is a base of the triode transistor, the input terminal is a collector of the triode transistor, and the output terminal is an emitter of the triode transistor.

11. The display panel according to claim 7, wherein the transistors are triode transistors, the conducting terminal is a base of the triode transistor, the input terminal is a collector of the triode transistor, and the output terminal is an emitter of the triode transistor.

12. The display panel according to claim 7, wherein, the display panel is a liquid crystal display.

* * * * *